(12) United States Patent
Manna et al.

(10) Patent No.: US 11,043,379 B2
(45) Date of Patent: Jun. 22, 2021

(54) CONFORMAL CARBON FILM DEPOSITION

(71) Applicant: Applied Materials, Inc., Santa Clara, CA (US)

(72) Inventors: Pramit Manna, Sunnyvale, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 16/433,101

(22) Filed: Jun. 6, 2019

(65) Prior Publication Data

US 2019/0385845 A1    Dec. 19, 2019

Related U.S. Application Data

(60) Provisional application No. 62/685,413, filed on Jun. 15, 2018.

(51) Int. Cl.
*H01L 21/02* (2006.01)

(52) U.S. Cl.
CPC .. *H01L 21/02592* (2013.01); *H01L 21/02527* (2013.01); *H01L 21/02642* (2013.01)

(58) Field of Classification Search
CPC ......... H01L 21/02527; H01L 21/02115; C23C 16/26
See application file for complete search history.

(56) References Cited

U.S. PATENT DOCUMENTS

| 8,361,906 B2 | 1/2013 | Lee et al. |
| 2008/0003824 A1 | 1/2008 | Padhi et al. |
| 2010/0239979 A1 | 9/2010 | Yeh et al. |
| 2012/0258261 A1* | 10/2012 | Reddy ............... H01L 21/31144 427/577 |
| 2017/0301537 A1 | 10/2017 | Behera et al. |

OTHER PUBLICATIONS

PCT International Search Report and Written Opinion in PCT/US2019/035695 dated Sep. 24, 2019, 12 pages.
Pradhan, D. , et al., "Opto-electrical properties of amorphous carbon thin film deposited from natural precursor camphor", Applied Surface Science, 2007, vol. 253, No. 17, pp. 7004-7010.
Ravani, Fotini , et al., "Graphene production by dissociation of camphor molecules on nickel substrate", Thin Solid Films, vol. 527, 2013, pp. 31-37.

* cited by examiner

*Primary Examiner* — Walter H Swanson
(74) *Attorney, Agent, or Firm* — Servilla Whitney LLC

(57) ABSTRACT

Methods for depositing an amorphous carbon layer on a substrate are described. A substrate is exposed to a carbon precursor having a structure of Formula (I). Also described are methods of etching a substrate, including forming an amorphous carbon hard mask on a substrate by exposing the substrate to a carbon precursor having the structure of Formula (I).

20 Claims, 2 Drawing Sheets

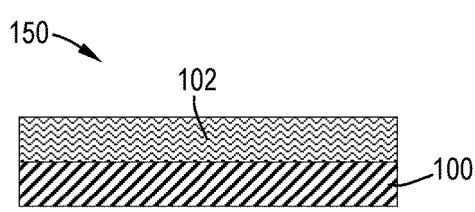
FIG. 1A
Prior Art
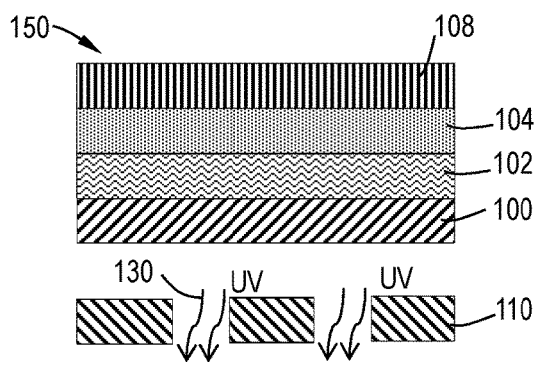
FIG. 1B
Prior Art
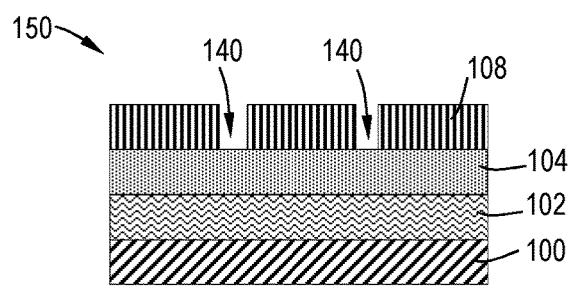
FIG. 1C
Prior Art
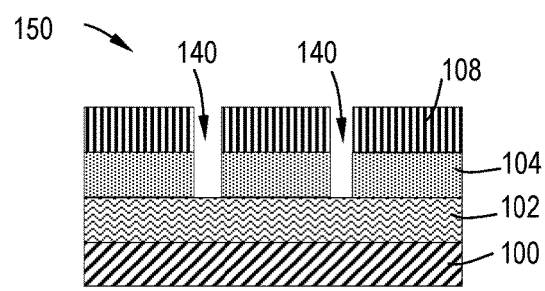
FIG. 1D
Prior Art
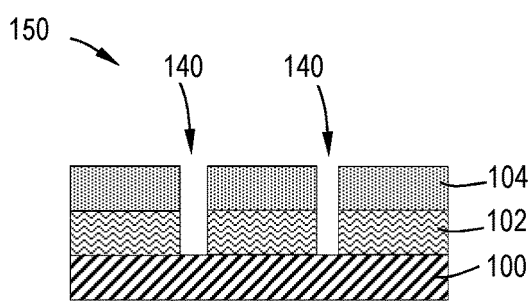
FIG. 1E
Prior Art
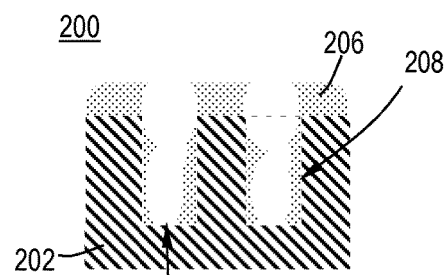
FIG. 2
Prior Art
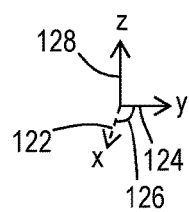

CONFORMAL CARBON FILM DEPOSITION

CROSS-REFERENCE TO RELATED APPLICATIONS

This application claims priority to U.S. Provisional Application No. 62/685,413, filed Jun. 15, 2018, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure provide methods of depositing carbon films that are conformal, which can be used for patterning applications.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist must correspondingly be reduced in order to control pattern resolution. Such thin resist layers can be insufficient to mask underlying material layers during the pattern transfer step due to attack by the chemical etchant. An intermediate layer (e.g., silicon oxynitride, silicon carbine, or a carbon film), called a hard mask, is often used between the energy sensitive resist layer and the underlying material layers to facilitate pattern transfer because of greater resistance to the chemical etchant. As critical dimensions (CD) decrease, hard mask materials having the desired etch selectivity relative to underlying materials (e.g., oxides and nitrides) as well as high deposition rates are desired. Multiple patterning schemes, however, require the development of films that are conformal and ashable.

Typically, ALD is used to deposit conformal films, but ALD is not a viable deposition technique for the deposition of carbon films. Therefore, there is a need for a method of depositing a carbon film that is conformable and ashable.

SUMMARY

Apparatuses and methods to manufacture integrated circuits are described. In one or more embodiments, a method of forming an amorphous carbon film on a substrate is described. In one embodiment, an amorphous carbon film is formed on a substrate by exposing the substrate to a carbon precursor having a structure of formula (I)

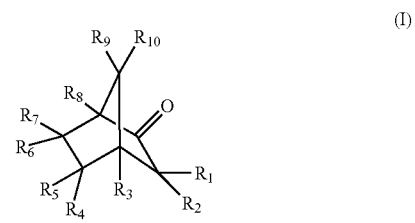

(I)

wherein each of $R_1$-$R_{10}$ are independently selected from H, a halogen, or a substituted or unsubstituted $C_1$-$C_4$ alkyl.

One or more embodiments provide a method of etching a substrate. An amorphous carbon hard mask is formed on the substrate. The amorphous carbon hard mask has at least one opening and is formed by exposing the substrate to a carbon precursor having a structure of formula (I)

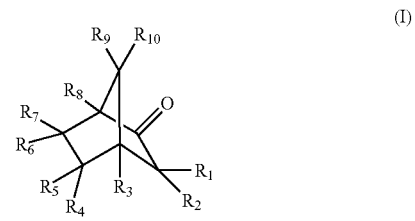

(I)

wherein each of $R_1$-$R_{10}$ are independently selected from H, a halogen, or a substituted or unsubstituted $C_1$-$C_4$ alkyl. The substrate is etched through the opening.

One or more embodiments are directed to a method. A substrate is provided having a substrate surface. The substrate is exposed to a carbon precursor at a temperature in the range of about 100° C. to about 650° C. and a pressure in the range of about 1 Torr to about 600 Torr to form a carbon hard mask on the substrate surface. The carbon precursor has a structure of formula (I)

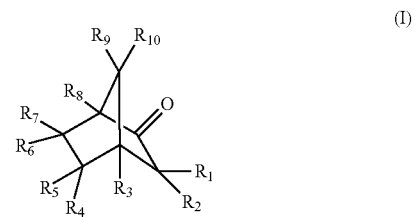

(I)

wherein each of $R_1$-$R_{10}$ are independently selected from H, a halogen or a substituted or unsubstituted $C_1$-$C_4$ alkyl. At least a portion of the substrate is etched through an opening in the carbon hard mask. The carbon hard mask is removed from the substrate surface by ashing.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1A illustrates a cross-sectional view of a substrate according to the prior art;

FIG. 1B illustrates a cross-sectional view of a substrate according to the prior art;

FIG. 1C illustrates a cross-sectional view of a substrate according to the prior art;

FIG. 1D illustrates a cross-sectional view of a substrate according to the prior art;

FIG. 1E illustrates a cross-sectional view of a substrate according to the prior art;

FIG. 2 illustrates a cross-sectional view of a substrate according to the prior art;

DETAILED DESCRIPTION

Figure 3:
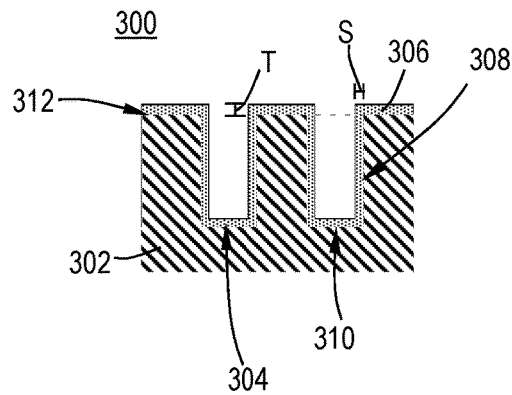
FIG. 3 illustrates a cross-sectional view of a substrate according to one or more embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the phrase "amorphous hydrogenated carbon," also referred to as "amorphous carbon" and denoted as a-C:H, refers to a carbon material with no long-range crystalline order which may contain a substantial hydrogen content, for example on the order of about 10 to 45 atomic %. Amorphous carbon is used as a hard mask material in semiconductor applications because of its chemical inertness, optical transparency, and good mechanical properties. Plasma enhanced chemical vapor deposition (PECVD) is widely used to deposit amorphous carbon films due to cost efficiency and film property versatility. In a PECVD process, a hydrocarbon source, such as a gas-phase hydrocarbon or vapors of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired amorphous carbon film thereon.

Device manufacturers using an amorphous carbon hard mask layer demand two critical requirements be met: (1) very high selectivity of the hard mask during the dry etching of underlying materials and (2) high optical transparency in the visible spectrum for lithographic registration accuracy. As used herein, the term "dry etching" generally refers to etching processes where a material is not dissolved by immersion in a chemical solution and includes methods such as reactive ion etching, sputter etching, and vapor phase etching. Further, for applications in which a hard mask layer is deposited on a substrate having topographic features, an additional requirement for an amorphous carbon hard mask is that the hard mask layer conformally covers all surfaces of the topographic features. As used herein, the term "topographic feature" refers to one or more of a trench, a via, a peak, or the like. The term "conformal" means that the film/coating adapts to the contours of a topographic feature. Conformality of a film/layer is typically quantified by a ratio of the average thickness of a layer deposited on the sidewalls of a feature to the average thickness of the same deposited layer on the field, or upper surface, of the substrate.

Despite the widespread use of PECVD to deposit amorphous carbon films, PECVD often results in amorphous carbon films that are non-conformal, have a large number of particles contaminating the substrate surface, and require substrates to be excessively heated.

The method of one or more embodiments, advantageously deposits an amorphous carbon film using a thermal chemical vapor deposition (CVD) process. The method advantageously provides deposition of an amorphous carbon film that has good etch selectivity, high optical transparency, can be conformally deposited on substrates having one or more feature, and can be produced at relatively low temperatures.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more dopants (e.g., nitrogen, fluorine, boron, silicon). In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

FIGS. 1A-1E illustrate schematic cross-sectional views of a substrate 100 at different stages of an integrated circuit fabrication sequence incorporating an amorphous carbon layer as a hard mask, according to the Prior Art. A substrate structure 150 denotes the substrate 100 together with other material layers formed on the substrate 100. FIG. 1A (prior art) illustrates a cross-sectional view of a substrate structure 150 having a material layer 102 that has been conventionally formed thereon. The material layer 102 may be a low-k material and/or an oxide, e.g., $SiO_2$. FIG. 1B (prior art) depicts an amorphous carbon layer 104 deposited on the substrate structure 150 of FIG. 1A. The amorphous carbon layer 104 is formed on the substrate structure 150 by conventional means, such as via PECVD. The thickness of amorphous carbon layer 104 is variable, depending on the specific stage of processing. Typically, amorphous carbon layer 104 has a thickness in the range of about 500 Å to about 10,000 Å. Depending on the etch chemistry of the energy sensitive resist material 108 used in the fabrication sequence, an optional capping layer (not shown) may be formed on amorphous carbon layer 104 prior to the formation of energy sensitive resist material 108. The optional capping layer functions as a mask for the amorphous carbon layer 104 when the pattern is transferred therein and protects amorphous carbon layer 104 from energy sensitive resist material 108. As depicted in FIG. 1B, energy sensitive resist material 108 is formed on amorphous carbon layer 104. The layer of energy sensitive resist material 108 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm. A pattern is introduced into the layer of energy sensitive resist material 108 by exposing energy sensitive resist material 108 to UV radiation 130 through a patterning device, such as a mask 110, and subsequently developing energy sensitive resist material 108 in an appropriate developer. After energy sensitive resist material 108 has been developed, the desired pattern, consisting of apertures/openings 140, is present in energy sensitive resist material 108, as shown in FIG. 1C (prior art). Thereafter, referring to FIG. 1D (prior art), the pattern defined in energy sensitive resist material 108 is transferred through amorphous carbon layer 104 using the energy sensitive resist material 108 as a mask. An appropriate chemical etchant is used that selectively etches amorphous carbon layer 104 over the energy sensitive resist material 108 and the material layer 102, extending apertures 140 to the surface of material layer 102. Appropriate chemical etchants include ozone, oxygen, or ammonia plasmas.

Referring to FIG. 1E (prior art), the pattern is then transferred through material layer 102 using the amorphous carbon layer 104 as a hard mask. In this process step, an etchant is used that selectively removes material layer 102 over amorphous carbon layer 104, such as a dry etch, i.e. a non-reactive plasma etch. After the material layer 102 is patterned, the amorphous carbon layer 104 can optionally be stripped from the substrate 100.

As noted above, in some applications, a hard mask layer may be deposited on a substrate with an underlying topographical feature, for example a trench, a via, or a peak. In these applications, an amorphous carbon layer that is highly conformal to the underlying topography is also desirable. FIG. 2 (prior art) illustrates a schematic cross-sectional view of a substrate 200 with a feature 204 and a non-conformal amorphous carbon layer 206 formed thereon. Because non-conformal amorphous carbon layer 206 does not completely cover the sidewalls 208 of feature 204, subsequent etching processes may result in unwanted erosion of sidewalls 208. The lack of complete coverage of sidewalls 208 by non-conformal amorphous carbon layer 206 may also lead to photoresist poisoning of the material under non-conformal amorphous carbon layer 206, which is known to damage electronic devices. Conformality of a layer is typically quantified by a ratio of the average thickness of a layer deposited on the sidewalls of a feature to the average thickness of the same deposited layer on the field, or upper surface, of the substrate.

In one or more embodiments, a method of forming an amorphous carbon film on a substrate is described. In one embodiment, an amorphous carbon film is formed on a substrate by exposing the substrate to a carbon precursor having a structure of formula (I)

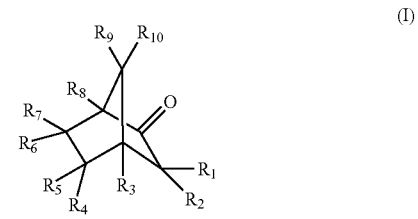

(I)

wherein each of $R_1$-$R_{10}$ are independently selected from H, a halogen, or a substituted or unsubstituted $C_1$-$C_4$ alkyl.

An advantage of the method of one or more embodiment is the enhancement of conformality over other amorphous carbon deposition processes, as illustrated in FIG. 3. FIG. 3 illustrates a cross-sectional view 300 of a substrate 302 with at least one feature 304 formed thereon. In one or more embodiment, the substrate includes at least one topographic feature, for example, a peak, a trench, or a via. As illustrated in FIG. 3, the substrate 302 includes at least one feature 304, which can be a trench. An amorphous carbon layer 306 is formed on the substrate 302, conformal to and filling the at least one feature 304. Amorphous carbon layer 306 illustrates the appearance of a carbon film deposited using the method of one or more embodiment.

Qualitatively, amorphous carbon layer 306 is highly conformal and completely covers sidewalls 308 and bottom surface 310 of the at least one feature 304. Referring to FIG. 3, quantitatively, amorphous carbon layer 306 may have a conformality that is greater than about 95%, wherein conformality is defined as the ratio of the average thickness S of amorphous carbon layer 306 deposited on the sidewalls 308 to the average thickness T of amorphous carbon layer 306 on upper surface 312 of substrate 302. In one or more embodiment, amorphous carbon layer 306 may have a conformality greater than about 95%, including greater than about 96%, greater than about 97%, greater than about 98%, and greater than about 99%. Referring back to FIG. 2 (prior art), non-conformal amorphous carbon layer 206, which illustrates the general appearance of a film deposited with precursors that are not of general Formula I, typically has a conformality of about less than about 75%.

In one or more embodiment, the amorphous carbon film is ashable. In or more embodiment, the amorphous carbon film is one or more of conformal or ashable. In one or more embodiment, the amorphous carbon film is both conformal and ashable.

Another advantage of the method of one or more embodiments is that a lower temperature process may be used to produce an amorphous carbon layer with the desired density and transparency. Ordinarily, higher substrate temperature during deposition is the process parameter used to encourage the formation of a higher density film. When the carbon precursors having a structure of Formula (I)

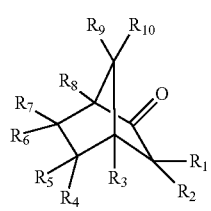

(I)

wherein each of $R_1$-$R_{10}$ are independently selected from H, a halogen, or a substituted or unsubstituted $C_1$-$C_4$ alkyl are used, substrate temperature may be reduced during deposition, for example to as low as about 300° C., and still produce a film of the desired density, i.e., from about 1.2 g/cc to about 1.8 g/cc. Hence, the method of one or more embodiment may produce a relatively high density film with an absorption coefficient as low as about 0.09. Further, lower processing temperatures are generally desirable for all substrates since this lowers the thermal budget of the process, protecting devices formed thereon from dopant migration.

In an embodiment, the substrate 302 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 302 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 302 can be, e.g., an organic, a ceramic, a glass, or a semiconductor substrate. Although a few examples of materials from which the substrate 302 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 302 includes one or more metallization interconnect layers for integrated circuits. In at least some embodiments, the substrate 302 includes interconnects, for example, vias, configured to connect the metallization layers. In at least some embodiments, the substrate 302 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate 302 includes one or more layers above substrate 302 to confine lattice dislocations and defects.

The amorphous carbon layer 306 is formed on the substrate by thermal chemical vapor deposition (CVD). The thickness of amorphous carbon layer 306 is variable. In one or more embodiment, the amorphous carbon layer 306 may have a thickness in a range of about 5 nm to about 50 nm, including a range of about 10 nm to about 30 nm. In one or more embodiment the amorphous carbon layer 306 may have a thickness in a range of about 5 nm to about 50 nm, including about 5 nm, about 10 nm, about 15 nm, about 20 nm, about 25 nm, about 30 nm, about 35 nm, about 40 nm, about 45 nm, and about 50 nm.

To form the amorphous carbon layer 306, the substrate 302 is exposed to a carbon precursor having a structure of Formula (I)

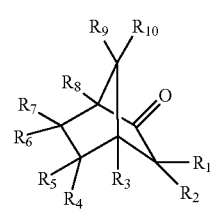

(I)

wherein each of $R_1$-$R_{10}$ are independently selected from H, a halogen, or a substituted or unsubstituted $C_1$-$C_4$ alkyl.

As used herein, "halogen" refers to one or more of a group of element in the periodic table, more particularly fluorine (F), chlorine (Cl), bromine (Br), iodine (I), and astatine (At).

As used herein, "alkyl," or "alk" includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. In one or more embodiments, each of $R_1$-$R_{10}$ are independently from H, a halogen, or a substituted or unsubstituted $C_1$-$C_4$ alkyl.

In one or more embodiments, the compound of Formula (I) comprises one or more of camphor, L-fenchone, 3-chloro-2-norbornanone, norbornanone, 1,3,7,7-tetramethyl-2-norbornanone, norcamphor, (1R)-(−)-fenchone, (+)-fenchone, (−)-or fenchone.

In one embodiment, the carbon precursor comprises camphor having a chemical structure of

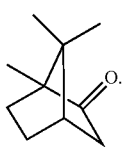

In one embodiment, the carbon precursor comprises L-fenchone, having a chemical structure of

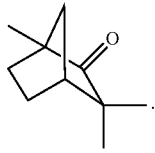

In one embodiment, the carbon precursor comprises 3-chloro-2-norbornanone, having a chemical structure of

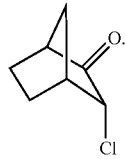

In one or more embodiment, the carbon precursor is introduced to the processing chamber, and is allowed to crack thermally. As used herein, the phrase "thermal cracking" describes the splitting of molecules under the influence of heat. In one or more embodiment, the substrate is maintained at a temperature range of about 100° C. to about 650° C. In one or more embodiment, the substrate is maintained a temperature of less than 600° C. In one or more embodiment, the substrate is maintained at a temperature in a range of about 300° C. to about 600° C. In one or more embodiment, the substrate is maintained at a temperature of less than about 300° C.

In one or more embodiment, the formation of the amorphous carbon film occurs at a pressure in a range of about 1 Torr to about 600 Torr.

In one or more embodiment, the amorphous carbon film is formed using a thermal decomposition process. In one or more embodiment, the amorphous carbon film is formed using thermal chemical vapor deposition (CVD). In one or more embodiment, the amorphous carbon film is deposited without the use, in the absence of, a plasma.

In one or more embodiment, the carbon precursor having a structure of formula (I)

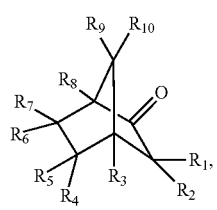

wherein each of $R_1$-$R_{10}$ are independently selected from H, a halogen, or a substituted or unsubstituted $C_1$-$C_4$ alkyl, is heated in an ampoule and flowed to the substrate with a carrier gas. As used herein, the term "carrier gas" refers to a fluid (either gas or liquid) that can move a precursor molecule from one location to another. For example, a carrier gas can be a liquid that moves molecules from a solid precursor in an ampoule to an aerosolizer. In some embodiments, a carrier gas is an inert gas. In one or more embodiment, a carrier gas is one or more of hydrogen ($H_2$), argon (Ar), helium (He), xenon (Xe), or nitrogen ($N_2$).

In one or more embodiment, the amorphous carbon film is a hard mask layer.

In one or more embodiment, the substrate has a layer to be patterned.

In one or more embodiment, the substrate comprises one or more of an adhesion layer or a dielectric layer.

One or more embodiments provide a method of etching a substrate. As used herein, the term "etching" refers to a process to chemical remove layers from the surface of a substrate, e.g. wafer, during semiconductor manufacturing. Etching is a critically important process during semiconductor manufacturing, and every substrate undergoes many etching steps before it is complete. In one or more embodiment, the substrate is protected from the etchant by a masking material, which resists etching. In one or more embodiments, the hard mask material is a photoresist, which has been patterned using photolithography.

Figure 4A:
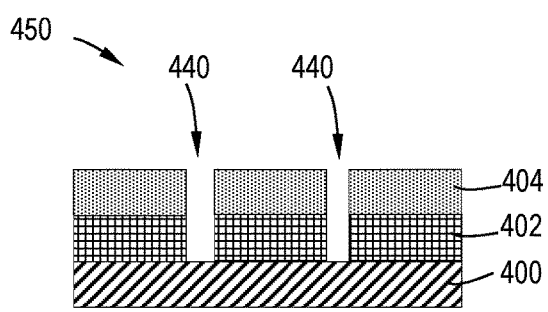
FIG. 4A illustrates a cross-sectional view of a substrate according to one or more embodiment.

One or more embodiments provide a method of etching a substrate. Referring to FIG. 4A, in one or more embodiment, an amorphous carbon hard mask 404 is formed on a substrate 400. In one or more embodiment, the amorphous carbon hard mask has at least one opening 440 and is formed by exposing the substrate to a carbon precursor having a structure of formula (I)

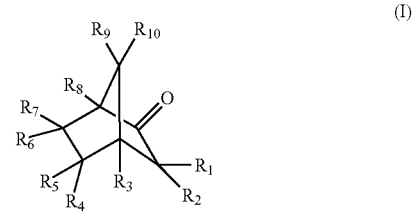

wherein each of $R_1$-$R_{10}$ are independently selected from H, a halogen, or a substituted or unsubstituted $C_1$-$C_4$ alkyl. In one or more embodiment, the substrate 400 is etched through the at least one opening 440.

In one or more embodiment, the amorphous carbon hard mask is formed at a temperature less than about 600° C. and a pressure in the range of about 1 Torr to about 600 Torr. In one or more embodiments, the amorphous carbon hard mask 404 has been patterned using photolithography or other methods known to those of skill in the art.

Figure 4B:
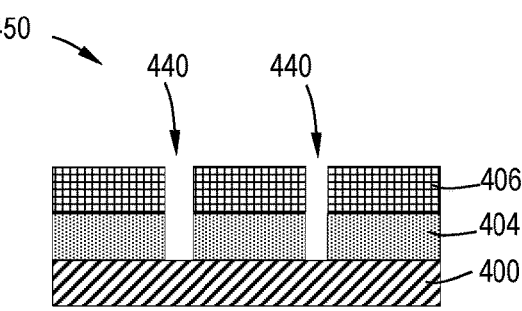
FIG. 4B illustrates a cross-sectional view of a substrate according to one or more embodiment.

In one or more embodiments, a photoresist is formed on the substrate prior to etching. In one or more embodiments, the photoresist 402 is formed between the substrate 400 and the amorphous carbon hard mask 404. Referring to FIG. 4B, in one or more embodiment, the photoresist 406 is formed on the amorphous carbon hard mask 404.

Figure 4C:
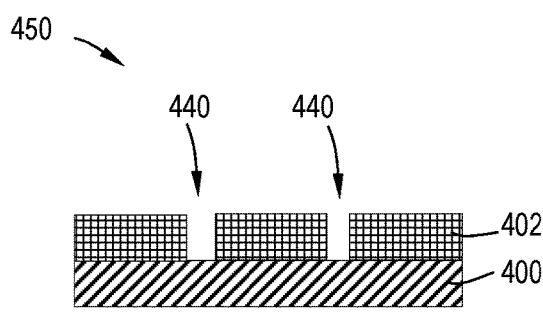
FIG. 4C illustrates a cross-sectional view of a substrate according to one or more embodiment.

Referring to FIG. 4C, after the substrate 400 is etched, in one or more embodiments, the amorphous carbon hard mask 404 is removed. In one or more embodiment, the amorphous carbon hard mask 404 is removed by ashing.

One or more embodiments are directed to a method. In one or more embodiment, a substrate is provided having a substrate surface. In one or more embodiment, the substrate is exposed to a carbon precursor at a temperature in the range of about 100° C. to about 650° C. and a pressure in the range of about 1 Torr to about 600 Torr to form a carbon hard mask on the substrate surface. The carbon precursor has a structure of formula (I)

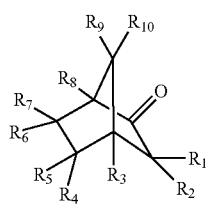

wherein each of $R_1$-$R_{10}$ are independently selected from H, a halogen or a substituted or unsubstituted $C_1$-$C_4$ alkyl. In one or more embodiment, at least a portion of the substrate is etched through an opening in the carbon hard mask. In one or more embodiment, the carbon hard mask is removed from the substrate surface by ashing.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method comprising forming an amorphous carbon film on a substrate by exposing the substrate to a carbon precursor in the absence of a plasma and at a temperature in a range of from 100° C. to less than 600° C., the carbon precursor having a structure of formula (I)

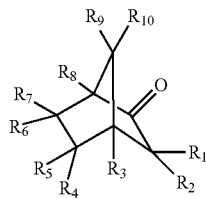

wherein each of $R_1$-$R_{10}$ are independently selected from H, a halogen, or a substituted or unsubstituted $C_1$-$C_4$ alkyl.

2. The method of claim 1, wherein the carbon precursor comprises one or more of camphor, L-fenchone, 3-chloro-2-norbornanone, norbornanone, 1,3,7,7-tetramethyl-2-norbornanone, norcamphor, (IR)-(−)-fenchone, (+)-fenchone, (−)-or fenchone.

3. The method of claim 1, wherein the temperature is in a range of from 300° C. to 600° C.

4. The method of claim 1, wherein the carbon precursor is heated in an ampoule and flowed to the substrate with a carrier gas.

5. The method of claim 4, wherein the carrier gas comprises one or more of hydrogen ($H_2$), argon (Ar), helium (He), xenon (Xe), or nitrogen ($N_2$).

6. The method of claim 1, wherein the amorphous carbon film is formed by a thermal decomposition process.

7. The method of claim 1, wherein the amorphous carbon film is one or more of conformal or ashable.

8. The method of claim 1, wherein the amorphous carbon film is a hard mask layer.

9. The method of claim 8, wherein the substrate comprises a layer to be patterned.

10. The method of claim 1, wherein the substrate comprises one or more of an adhesion layer or a dielectric layer.

11. The method of claim 1, wherein the substrate comprises at least one feature selected from a peak, a trench, or a via.

12. The method of claim 11, wherein the amorphous carbon film is conformal.

13. The method of claim 1, wherein the amorphous carbon film has a hydrogen content in a range of from 10 to 45 atomic %.

14. A method of etching a substrate comprising:
forming an amorphous carbon hard mask on the substrate, the amorphous carbon hard mask deposited in the absence of a plasma and at a temperature range of from 100° C. to less than 600° C., and the amorphous carbon hard mask having at least one opening and formed by exposing the substrate to a carbon precursor having a structure of formula (I)

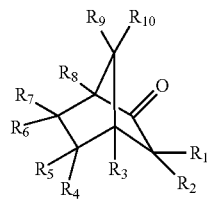

wherein each of $R_1$-$R_{10}$ are independently selected from H, a halogen or a substituted or unsubstituted $C_1$-$C_4$ alkyl; and etching the substrate through the at least one opening.

15. The method of claim 14, wherein the carbon precursor comprises one or more of camphor, L-fenchone, 3-chloro-2-norbornanone, norbornanone, 1,3,7,7-tetramethyl-2-norbornanone, norcamphor, (IR)-(−)-fenchone, (+)-fenchone, (−)-or fenchone.

16. The method of claim 14, further comprising forming a photoresist prior to etching, the photoresist formed between the substrate and the amorphous carbon hard mask or on the amorphous carbon hard mask.

17. The method of claim 14, further comprising removing the amorphous carbon hard mask after etching the substrate.

18. The method of claim 17, wherein the amorphous carbon hard mask is removed by ashing.

19. The method of claim 14, wherein the amorphous carbon hard mask is formed at a pressure in a range of 1 Torr to 600 Torr.

20. A method comprising:
providing a substrate having a substrate surface;
exposing the substrate to a carbon precursor at a temperature in a range of from 100° C. to 650600° C. and a pressure in a range of from 1 Torr to 600 Torr to form a carbon hard mask on the substrate surface, the carbon hard mask deposited in the absence of a plasma, and the carbon precursor having a structure of formula (I)

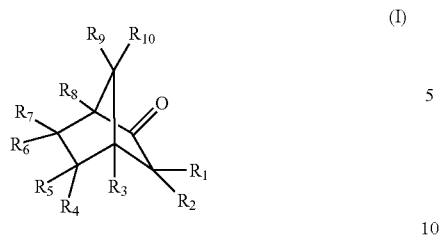
(I)
wherein each of $R_1$-$R_{10}$ are independently selected from H, a halogen or a substituted or unsubstituted $C_1$-$C_4$ alkyl;
etching at least a portion of the substrate through an opening in the carbon hard mask; and
removing the carbon hard mask from the substrate surface by ashing.
* * * * *

UNITED STATES PATENT AND TRADEMARK OFFICE
CERTIFICATE OF CORRECTION

| | | |
|---|---|---|
| PATENT NO. | : 11,043,379 B2 | Page 1 of 1 |
| APPLICATION NO. | : 16/433101 | |
| DATED | : June 22, 2021 | |
| INVENTOR(S) | : Pramit Manna et al. | |

It is certified that error appears in the above-identified patent and that said Letters Patent is hereby corrected as shown below:

In the Claims

Claim 20, Column 12, Line 62, replace "650600° C." with "600° C.".

Signed and Sealed this
Sixth Day of June, 2023

Katherine Kelly Vidal
*Director of the United States Patent and Trademark Office*